(12) United States Patent
Blanchard

(10) Patent No.: US 6,730,963 B2
(45) Date of Patent: *May 4, 2004

(54) MINIMUM SIZED CELLULAR MOS-GATED DEVICE GEOMETRY

(75) Inventor: Richard A. Blanchard, Los Altos, CA (US)

(73) Assignee: JBCR Innovations, LLP, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/263,485

(22) Filed: Oct. 2, 2002

(65) Prior Publication Data

US 2003/0075729 A1 Apr. 24, 2003

Related U.S. Application Data

(62) Division of application No. 09/576,090, filed on May 22, 2000, now Pat. No. 6,492,663.
(60) Provisional application No. 60/134,999, filed on May 20, 1999.

(51) Int. Cl.⁷ ............................................. H01L 29/76
(52) U.S. Cl. ...................... 257/341; 257/328; 257/329
(58) Field of Search .............................. 257/328, 329, 257/341

(56) References Cited

U.S. PATENT DOCUMENTS

| 4,495,513 | A | 1/1985 | Descamps |
| 4,639,754 | A | 1/1987 | Wheatley, Jr. et al. |
| 4,860,072 | A | 8/1989 | Zommer |
| 5,216,275 | A | 6/1993 | Chen |
| 6,492,663 | B1 * | 12/2002 | Blanchard .................. 257/164 |
| 6,563,170 | B2 * | 5/2003 | Kim .......................... 257/341 |

FOREIGN PATENT DOCUMENTS

| JP | 59231860 A | 12/1984 |
| JP | 60254658 A | 12/1985 |

* cited by examiner

Primary Examiner—Douglas Wille
(74) Attorney, Agent, or Firm—Richard K Robinson

(57) ABSTRACT

A semiconductor device is disclosed and includes a drain region of a first conductivity type, having a first major surface. Diffused into the drain region is a body region of a second conductivity type. A source region is diffused in the body region and it has a general polygonal shape when viewed at the first major surface with two notches directed towards the center of the source region from opposite sides. The body region is accessible through the notches. An oxide layer covers the source and body regions except for a contact opening position over the source region between the two notches exposing only that portion of the source region that is between the two notches and at least a portion of the accessible body region in each of the two notches to facilitate a source contact.

3 Claims, 5 Drawing Sheets

MINIMUM SIZED CELLULAR MOS-GATED DEVICE GEOMETRY

PRIORITY STATEMENT UNDER 35 U.S.C. 119 (E) AND 37 C.F.R. 1.78.

"This application is a division of application No 09/576,090, filed May 22, 2000, now U.S. Pat. No. 6,492,663."

This non-provisional application claims priority based upon the prior U.S. Provisional Patent Application No. 60/134,999, filed May 20, 1999 entitled "A Minimum Size Cellular MOS-Gated Device Geometry" in the name of Richard A. Blanchard.

BACKGROUND OF THE INVENTION

This invention relates generally to semiconductor devices and methods of manufacturing the same, and more particularly to devices such as Metal Oxide Semiconductor (MOS) transistors, Insulated Gate Bipolar Transistors (IGBTs) and MOS-gated conductivity modulated devices including MOS-controlled thyristors (MCTs).

The designers of MOS transistors are often faced with the dilemma of improving the on-resistance of an MOS semiconductor device, while at the same time preventing the device from latching up from the conduction of a parasitic bipolar transistor formed by the source, body and drain regions of the semiconductor device.

This problem was discussed in U.S. Pat. No. 4,860,072 entitled Monolithic Semiconductor Device and Method of Manufacturing Same. The patent disclosed a monolithic semiconductor device for use in various applications such as lateral and vertical MOS transistors, insulated gate conductivity modulated devices and the like, as well as a method of manufacturing same. This device includes source, body and drain regions, with the body region including a channel section which is disposed adjacent an insulated gate formed on the surface of the device. The source region includes a central contact area flanked by a pair of body segments which extend up through the source region and which create a resistive path between the source contact area and the channel section. A voltage is developed across the resistive path which tends to maintain a parasitic bipolar transistor that is formed by the source, body and drain regions in a non-conducting state. A source metallization bridges the two body segments and the intermediate source contact thereby shorting the body region to the source. The geometry of the device is reduced since the contact area need not be increased to ensure that the source metallization contacts the entire source as well as both body segments.

Similarly, in U.S. Pat. No. 4,639,754, a Vertical MOSFET with Diminished Bipolar Effects disclosed an IGFET device that includes a semiconductor wafer having a first conductivity type drain region contiguous with a wafer surface. A second conductivity type body region extends into the wafer from the wafer surface so as to form a body-drain PN junction having an intercept at the surface; the body region further including a body-contact portion of relatively high conductivity disposed at the surface. A first conductivity type source region extends into the wafer so as to form a source-body PN junction which has first and second intercepts at the surface. The first intercept is spaced from the body-drain intercept so as to define a channel region in the body region at the surface, and the second intercept is contiguous with the body contact portion. The second intercept is relatively narrowly spaced from the first intercept along most of the length of the first intercept and is relatively widely spaced from the first intercept at one or more predetermined portions. A source electrode contacts both the body-contact portion and the source region at the wafer surface.

In U.S. Pat. No. 4,495,513 entitled Bipolar Transistor Controlled by Field Effect by Means of an Isolated Gate there is disclosed a bipolar semiconductor structure in which the conductive and blocked states are controlled by an isolated gate. The structure comprises a P+ type substrate constituting the emitter of a bipolar transistor, an N type epitaxial layer constituting the base, a P+ type area having a large surface, constituting a collector, covered with a collector contract and surrounded by an area wherein the epitaxial N type layer is exposed, an N+ type source area included in the collector area and extending along the border of the same so as to define an interval which constitutes the control gate of the structure, a resistive source access zone connected, on the one hand, to the source, and on the other hand, to the collector contact, the resistance of this zone being sufficient for preventing the structure from being rendered conductive in an irreversible manner.

However, none of the devices achieves a interdigitated and/or cellular geometry that allows the optimization of both device on-resistance and ruggedness.

SUMMARY OF INVENTION

A semiconductor device is disclosed and includes a drain region of a first conductivity type, having a first major surface. Diffused into the drain region is a body region of a second conductivity type. A source region is diffused in the body region and it has a general polygonal shape when viewed at the first major surface with two notches directed towards the center of the source region from opposite sides. The body region is accessible through the notches. An oxide layer covers the source and body regions except for a contact opening position over the source region between the two notches exposing only that portion of the source region that is between the two notches and at least a portion of the accessible body region in each of the two notches to facilitate a source contact.

The polygonal geometry shape with opposing notches in the source and the location of the contact to the source increases the resistance of the source between the channel region and the source contact. This structure lends itself to both cellular and interdigitated configurations. The reduced size of the source contact in conjunction with the two notches in the source allows for a smaller cell size, which in turn allows greater cell density and lowers the overall RDS(on) of the device.

BRIEF DESCRIPTION OF THE FIGURES

Objects and advantages of the invention will become apparent upon reading the following detailed description and upon reference to the drawings, wherein like references characters are used throughout to designate like parts.

DETAILED DESCRIPTION OF THE EMBODIMENTS

Figure 1:
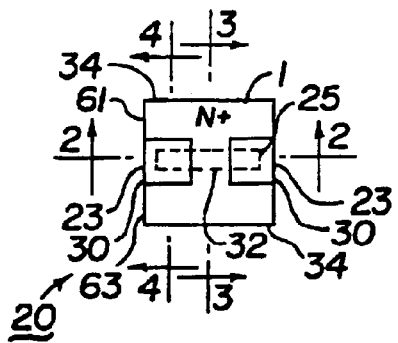
FIG. 1 is a single cell top view of a MOS-gated power device showing a square or a rectangular layout according to the invention.

FIG. 1 is a top view of a cell 20 that includes the N+ source region 1 and a P body region 23. P-type body region 23 usually consists of a combination of two P-type diffusions that do not totally overlap on the surface of the device. Dashed lines represent the contact area 25 for the source and body regions. The N+ source region 1 has a square shape with two opposing notches 30. A contact area 32 for just the source is centrally located between the outer edges of the two opposing notches 30. The source contact area 32 is positioned to be a maximum distance from the channel area beneath the edges 34 of the source region 1.

Figure 2:
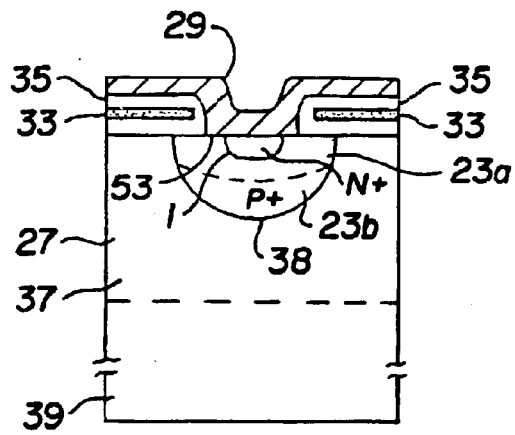
FIG. 2 is a cross-sectional view as seen from section line II—II of FIG. 1.

FIG. 2 is a cross-sectional view of FIG. 1 as seen by section lines 11—11. The P body region 23 is diffused into an N type drain region 27 that also includes an N− region 37 and an N+ region 39. Typically, the N+ region 39 is connected to a drain contact not shown. The source region 1 is connected to the source metal 29 at contact area 25. The source metal 29 overlaps the source region 1. The drain region 27 includes an N+ region 39 and N− region 37 where the P-body region 23 extends into the N− region 27. Traditionally, the deep P+ portion of region 23b extends approximately two to ten microns into the N− region 37. However, with the invention of U.S. Pat. No. 5,216,275, which is incorporated herein by reference, the P body region can extend way into the N− region 37 substantially more than the two to ten microns. In fact, it can approach to very nearly touching the N+ region 39 or can, with the help of a thin dielectric layer between the P+ region and the N+ region 39, extend to the N+ region. Alternatively, by making the features of the cell 20 small and with the added resistance with the layout of FIG. 1, the deep P+ diffused portion of P-type region 23 may be eliminated. The bottom N+ region 39 is usually connected to a metal layer that serves as the drain contact.

Figure 3:
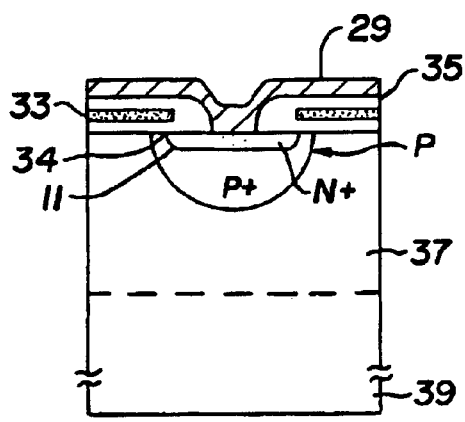
FIG. 3 is a cross-sectional view as seen from section line III—III of FIG. 1.

A gate polysilicon layer 33 is shown extending over the P body region 23 but from section lines II—II a channel region such as channel region 11 of FIG. 3 is not present under the gate layer 23. An gate oxide layer 35 insulates the gate polysilicon layer 33 from the source region 1 and the P body region 23. A second dieletric layer, often of silicon dioxide, separates gate poly layer from source metal 29. The source contact metal 29 contacts the P body region 23 in the opposing grooves 30 at contact area 53.

FIG. 3 is a cross-sectional view of the embodiment of FIG. 1 as seen from section lines III—III and illustrates the N+ region 39, the N region 37, the body region 23 and the source region 1. The source metal contact 29 is shown over the source region 1 between the opposing grooves 30. The channel region 11 is located beneath the edges 34 of the source region 1. The conductivity of the P body region 23 in the channel region 11 changes from a P type to an N type conductivity when a positive potential of the proper magnitude is applied to the gate polysilicon 33. This change in conductivity facilitates the conduction of carriers between the source region 1 and the N+ region 39 (the drain).

Figure 4:
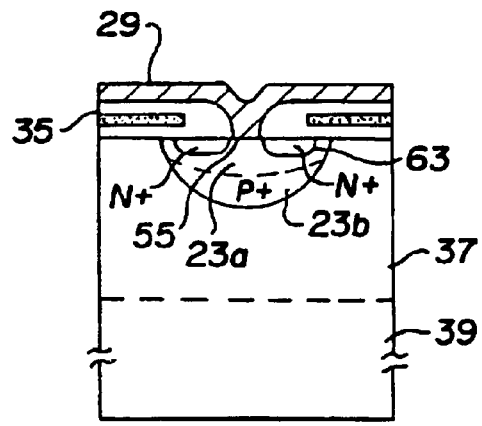
FIG. 4 is a cross-sectional view of FIG. 1 as seen from section line IV—IV.

FIG. 4 is a cross-sectional view of the embodiment of FIG. 1 as seen from dimension lines IV—IV and illustrates a first prong 61 and a second prong 63 of the source region 1. As can be seen at area 59, neither the first prong 61 nor the second prong 63 contacts the source metal 29.

Figure 5:
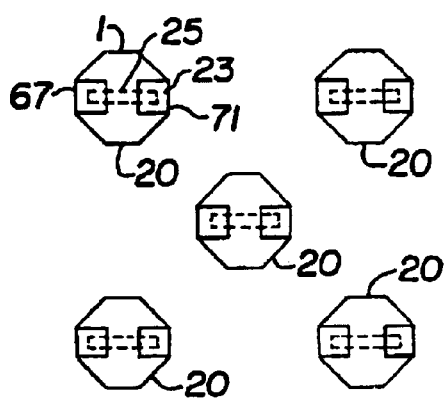
FIG. 5 is a top down of a MOS-gated power device showing a first octagonal cell layout according to the invention.

FIG. 5 illustrates an alternate shape for each cell from the embodiment of FIG. 1. Each cell 20 has an octagon shape. Each has two notches 67 and 71 in the source region 1, in which a portion of the P body region 23 is available to contact with the source metal layer 29. This shape provides for a minimum size for each cell when a plurality of cells are utilized. However, any polygonal shape may be utilized such as hexagonal, square, round and rectangular so long as there are two opposing slots to expose the P+ body diffusion 23.

In FIG. 5, each cell 20 may be smaller than other previous cells. Therefore, more cells may be connected in parallel per unit area resulting in the reduction in RDS(on), the on resistance.

Figure 6:
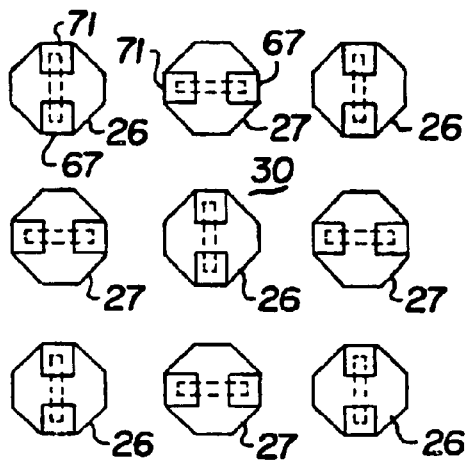
FIG. 6 illustrates a second octagonal cell layout according to the invention.

In FIG. 6 the notches 67 and 71 of each cell 27 are perpendicular to the two notches 67 and 71 of each cell 26. Each cell 27 is orientated such that its notches 57 and 71 are not in alignment with the notches of any adjacent cell 26. However, the notches 67 and 71 of each cell 26 are in alignment with the notches of any other cell 26 and similarly for each cell 27. The embodiment of FIG. 6 provides for more efficient carrier injection into the channel regions over the embodiment of FIG. 5.

FIG. 7 illustrate the steps of manufacturing a semiconductor device according to the invention. Referring to FIG. 7a, a wafer 51 having an N+ conductivity has an epitaxial layer 37 created either by growth or deposition. A field oxide layer 32 is then grown, masked and etched to create the active layer 50.

Figure 7A:
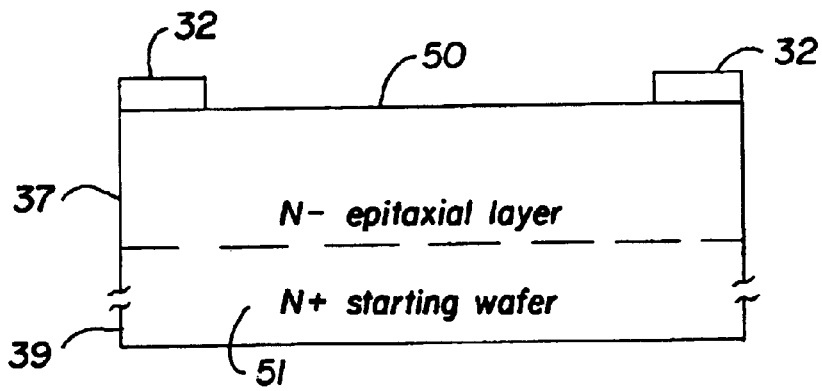
FIGS. 7a through 7d provide a cross section of the process steps for manufacturing the device according to the invention.

On the active layer 50, as shown in FIG. 7a, a gate oxide 35 is grown on which the gate polysilicon 33 is deposited and doped. A second masked and etch step is performed on the gate polysilicon 33 and the gate oxide 35 is also etch.

Figure 7B:
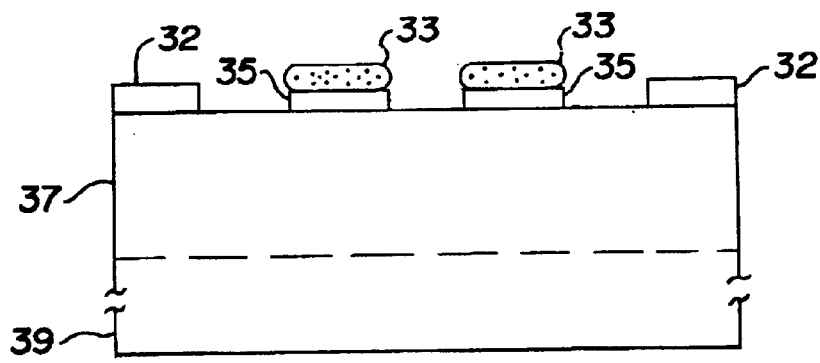
Figure 7C:
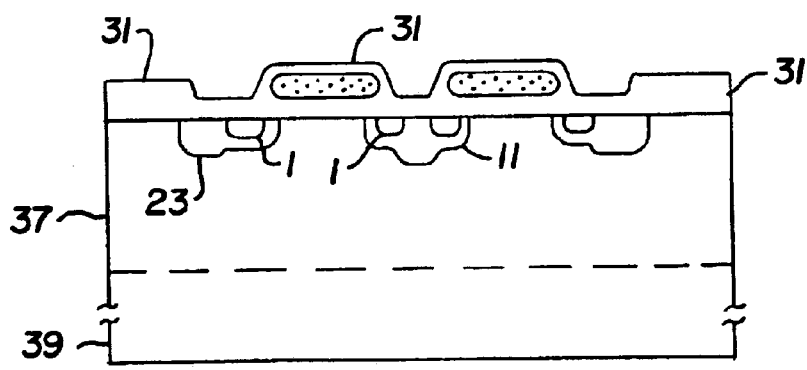

In FIG. 7b, the deep P+ is implanted through a masked followed by the P− doping with no mask present. The P-type body dopent is introduced through the opening in the gate oxide. The source region 1 is then masked for the N+ implant following which there is a diffusion step and a oxide deposition 31, (FIG. 7c).

Figure 7D:
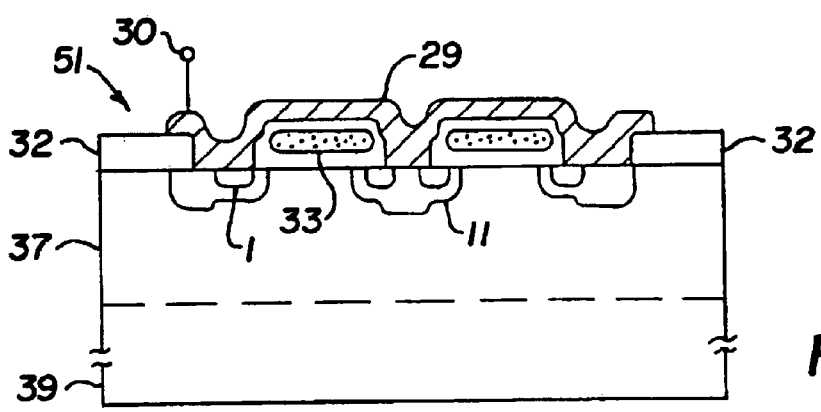

In FIG. 7d for the source metal 29, the active region 51 is masked, etched and a metal deposition is performed. The deposited metal is then masked and etched to create the semiconductor device.

Figure 8:
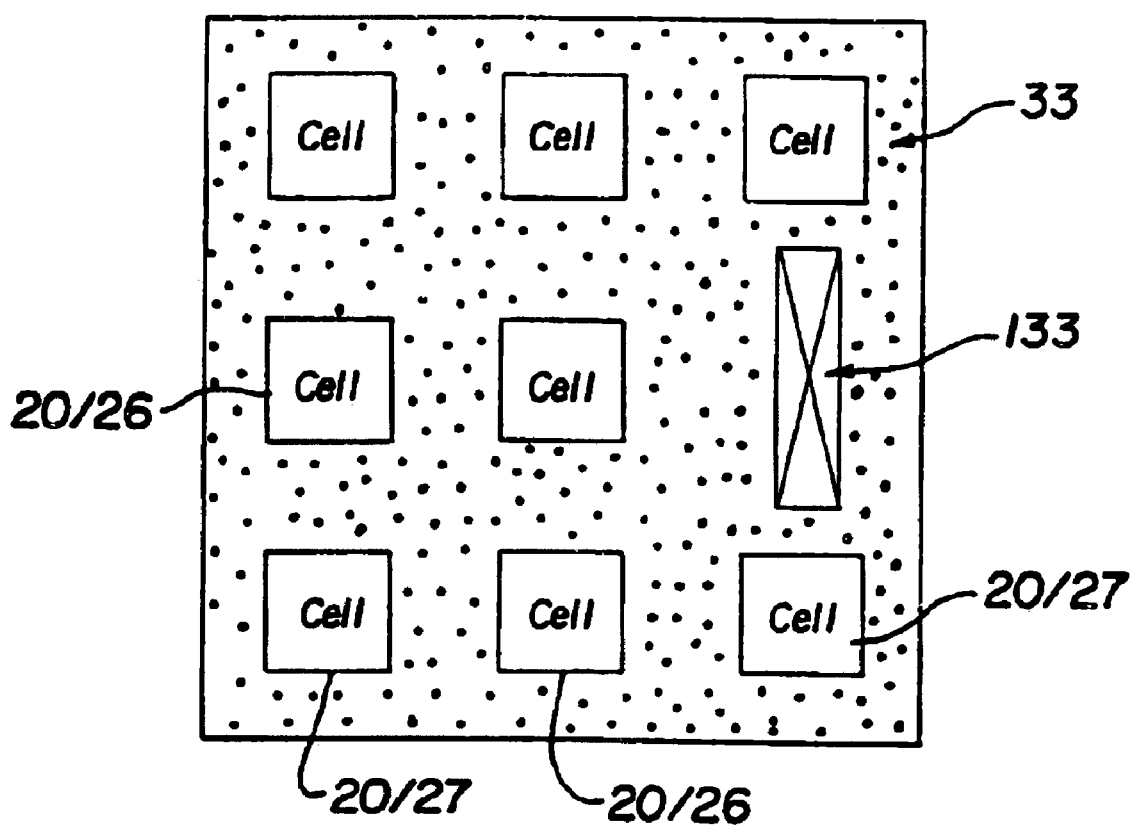
FIG. 8 is a top down view showing the gate of a square layout and the gate connection to a semiconductor device according to the invention.

FIG. 8 illustrates the gate contact to each of the cells 20 or 26 and 27 depending on which embodiment is being practiced. The gate covers the majority of the surface of the device, and, when properly biased, allows carriers to flow from the source of the device to the drain of the device through channel region 11.

Figure 9:
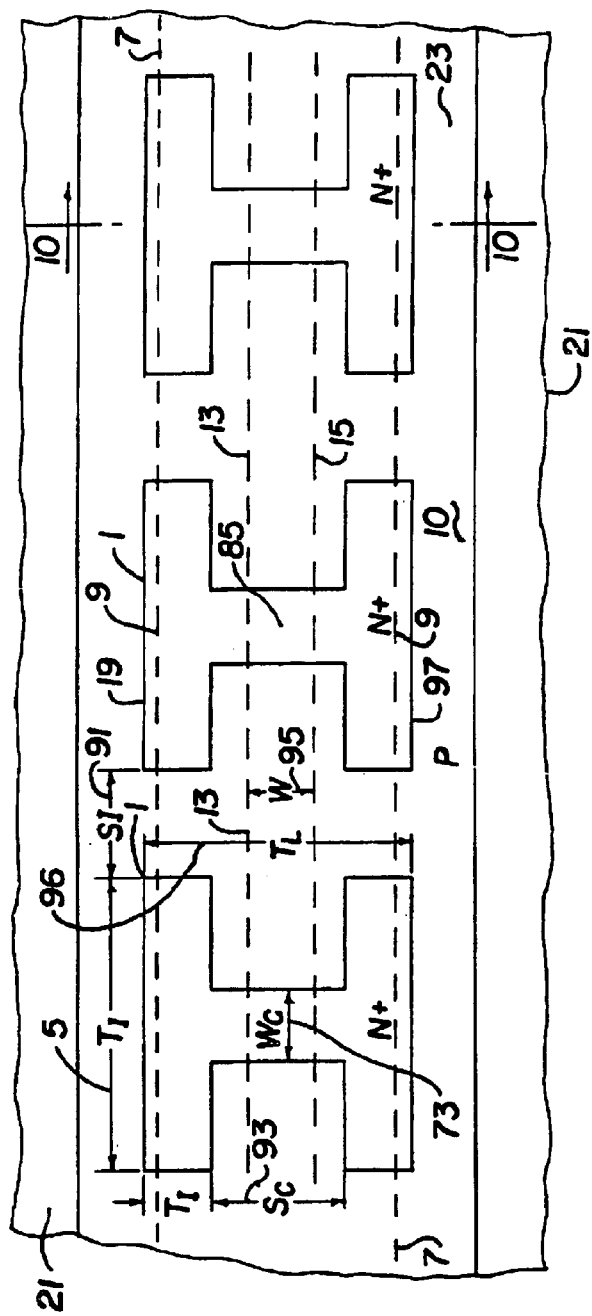
FIG. 9 is an illustration of a portion of an interdigitated layout of a MOS-gated power device according to the invention.

In FIG. 9, there is illustrated a top down view of an interdigitated layout having three source regions 1 in a group 10. Each source region 1 includes an N+ doping area having the shape of the capital letter "I". The widest area, $T_I$ of the "I" is represented by dimension lines 5. The thinnest area, $W_C$ of the N+ source region has a dimension represented by dimension lines 73. The separation between each source region 1, SI, is represented by dimension lines 91. The height of the top of the letter "I" from the bottom of the letter "I" is $T_L$, represented by dimension line 96. The internal dimension $S_C$, is represented by dimension line 93. There is a contact region identified by dashed lines 13 and 15 having a width "W" represented by dimension line 95. The contact region width W is less than $S_C$. Therefore, the series resistance between the contact area 85 to the ends of the letter "I", the top end 19 and the bottom end 97 provides a current path so that the current will flow from the contact area 85 to the end of the source region 1. This length adds a series resistance in the source region 1 which enables the devices to have a more rugged performance. Ruggedness is the ability of a semiconductor device to avoid latch up.

Figure 10:
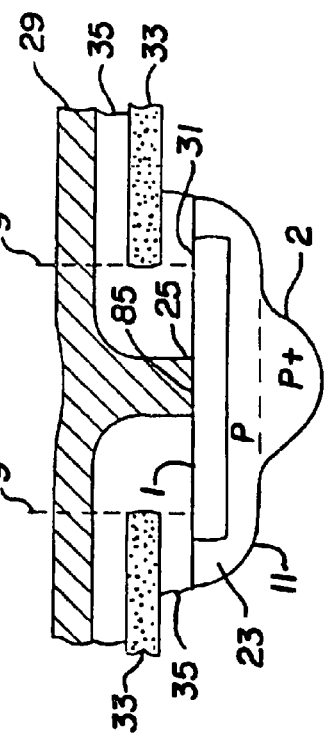
FIG. 10 is a cross-sectional view of the power device of FIG. 9 as seen along sectional line X—X.

FIG. 10 is a cross sectional view of the embodiment of FIG. 9 as seen from section lines X—X. There is a deep P+ region 2 beneath the P region 23. A source region 1 extends over a channel region 11 as with the cellular embodiment. There is an oxide layer 31 covering both the P region 23 and the source region 1 except for an opening through which the contact metal 29 passes. A layer of oxide 35 insulates the top of the gate 33 from the source metal layer 29. Dashed line 9 illustrates the position of the gate polysilicon layer 33 just over the edge of the source region 1 and the channel 11.

Figure 11:
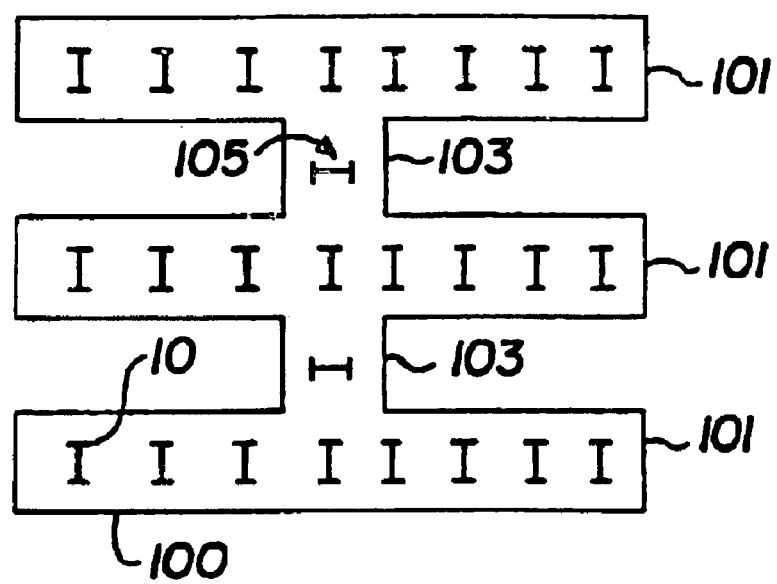
FIG. 11 is a top view of an interdigitated MOS-gated power device according to the invention.

The top view of an interdigitated MOS-gated power device 100 is illustrated in FIG. 11 where the embodiment of FIG. 9 has been extended to form a multiple source region 10 device. The configuration of the device 100 is that of multiple parallel rows 101 that are joined together by connections 103. The source regions 20 in connection 103 may be in line with the source regions 20 of the parallel rows 101 or perpendicular to them as shown at 105.

Figure 12:
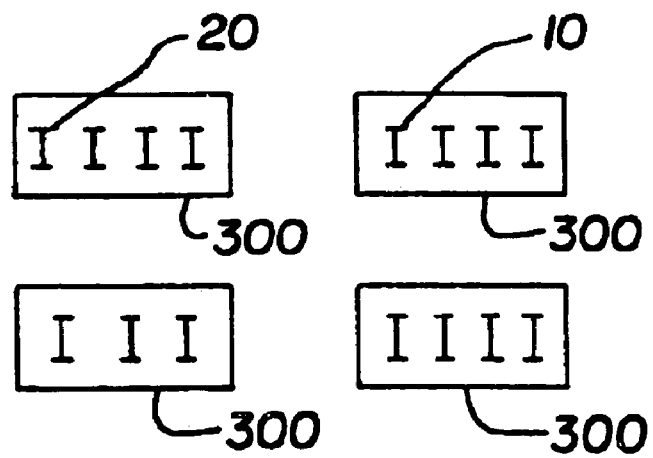
FIG. 12 is a top view of an extended cell layout of a MOS-gated power device according to the invention.

In FIG. 12 the source regions 20 are arranged in a number of extended cells 300. The extended cells may be arrange in the embodiment of FIGS. 5 are 6 with many of the same advantages being provided.

The above embodiments were shown illustrating a particular conductivity type. However, as is well know in the art the conductivity may be switch from N to P and P to N.

What is claimed is:

1. A semiconductor device including a plurality of transistor cells with each cell comprising:
   a drain region of a first conductivity type, having a first major surface;
   a body region of a second conductivity type being located in the drain region and extending into the drain region from the first major surface;
   a source region of the first conductivity type including a first and second prong, the first and second prongs being spaced apart from each other and each prong having an attached region and a first and second end and a connector region connecting the attached region of the first prong to the attached region of the second prong to create a first and second notch between the first and second prongs, the first and second notches being spaced apart from each other by the connector region, the body region being accessible through the first and second notches;
   an oxide layer covering the source and body regions having a contact opening position over the source region between the two notches exposing a contact area including the connector region of the source region and at least a portion of the accessible body region through at least the first notch;
   a source conductor positioned on the oxide layer and passing through the contact opening to connect with the body region and the source region between the first and second prongs without extending to either of the first and second ends of the first and second prongs; and;
   a gate layer positioned in the oxide layer over a portion of the body region and also over at least one edge of the source region that is furthest from the contact area of each member of the plurality of transistor cell and wherein the first and second prongs of each cell have either a first orientation or a second orientation, and with each cell having prongs with the first orientation being located adjacent to a cell having prongs with the second orientation.

2. A semiconductor device comprising:
   a drain region of a first conductivity type, having a first major surface;
   a cell of a body region of a second conductivity type being located in the drain region and extending into the drain region, a source region of the first conductivity type including a first and second prong, the first and second prongs being spaced apart from each other and each prong having an attached region and a first and second end and a connector region connecting the attached region of the first prong to the attached region of the second prong to create a first and second notch between the first and second prongs, the first and second notches being spaced apart from each other by the connector region, the body region being accessible through the first and second notches;
   an oxide layer covering the source and body regions having a contact opening position over the source region between the two notches exposing only a contact area of the source region that is between the two notches and at least a portion of the accessible body region through each notch; and
   a source conductor positioned on the oxide layer and passing through the contact opening to connect with the body region and the source region between the first and second notches without contacting the first and second ends and wherein the device includes a plurality of cells located in the substrate having a first alignment of the two notches that is perpendicular to the alignment of two notches of each neighboring cell.

3. A semiconductor device including a plurality of transistor cells with each cell comprising:
   a drain region of a first conductivity type, having a first major surface;
   a body region of a second conductivity type being located in the drain region and extending into the drain region from the first major surface;
   a source region of the first conductivity type including a first and second prong, the first and second prongs being spaced apart from each other and each prong having an attached region and a first and second end and a connector region connecting the attached region of the first prong to the attached region of the second prong to create a first and second notch between the first and second prongs, the first and second notches being spaced apart from each other by the connector region, the body region being accessible through the first and second notches;
   an oxide layer covering the source and body regions having a contact opening position over the source region between the two notches exposing a contact area including the connector region of the source region and at least a portion of the accessible body region through at least the first notch;

a source conductor positioned on the oxide layer and passing through the contact opening to connect with the body region and the source region between the first and second prongs without extending to either of the first and second ends of the first and second prongs; and;

a gate layer positioned in the oxide layer over a portion of the body region and also over at least one edge of the source region that is furthest from the contact area of each member of the plurality of transistor cells and wherein the plurality of cells are arranged into subgroups of cells with each connector region having the same orientation and the source conductor being a single conductor connecting to the body region and the source region between the first and second prongs of each cell without extending to either of the first and second ends of the first and second prongs.

* * * * *